United States Patent [19]
Tamamura et al.

[11] Patent Number: 5,695,556
[45] Date of Patent: Dec. 9, 1997

[54] DETERMINATION OF CRITICAL FILM THICKNESS OF A COMPOUND SEMICONDUCTOR LAYER, AND A METHOD FOR MANUFACTURING A SEMICONDUCTOR DEVICE USING THE METHOD OF DETERMINATION

[75] Inventors: Koshi Tamamura, Tokyo; Hironori Tsukamoto, Kanagawa; Masaharu Nagai, Kanagawa; Masao Ikeda, Kanagawa, all of Japan

[73] Assignee: Sony Corporation, Tokyo, Japan

[21] Appl. No.: 555,834

[22] Filed: Nov. 13, 1995

[30]     Foreign Application Priority Data

Nov. 14, 1994   [JP]   Japan ................................. 6-278738

[51] Int. Cl.$^6$ ................................................ C30B 25/16
[52] U.S. Cl. ............................. 117/85; 117/86; 117/55; 437/7; 437/8
[58] Field of Search ......................... 117/85, 86, 55; 437/7, 8

[56]              References Cited

U.S. PATENT DOCUMENTS

| | | | |
|---|---|---|---|
| 5,100,832 | 3/1992 | Kitagawa et al. | 437/106 |
| 5,187,116 | 2/1993 | Kitagawa et al. | 437/105 |
| 5,213,985 | 5/1993 | Sandroff et al. | 117/85 |
| 5,463,977 | 11/1995 | Manada et al. | 117/85 |

OTHER PUBLICATIONS

Parbrook et al, "Critical Thickness of Common–Anion II–VI Strained Layer Superlattices (SLSs)". Journel of Crystal Growth, vol. 117 pp. 492–496, 1992.

*Primary Examiner*—Robert Kunemund
*Attorney, Agent, or Firm*—Hill, Steadman & Simpson

[57]                ABSTRACT

By applying the method, the critical film thickness of a compound semiconductor layer is determined, and a semiconductor device having a compound semiconductor layer with an optimized film thickness excellent in emitting performance is manufactured.

The relationship between film thickness of a compound semiconductor layer and photoluminescence (PL) corresponding to the film thickness is obtained by measurement, the film thickness where PL exhibits a peak is designated as critical film thickness. The semiconductor layer comprises II–VI group compound semiconductor layer containing at least cadmium. The relationship between the critical film thickness and cadmium composition ratio is obtained by measurement. An equation which approximates the relationship between the critical film thickness and cadmium composition ratio is formulated. When a semiconductor device is manufactured, a compound semiconductor layer is formed so as that the thickness of the layer is thinner than the critical film thickness determined from the equation.

7 Claims, 5 Drawing Sheets

DETERMINATION OF CRITICAL FILM THICKNESS OF A COMPOUND SEMICONDUCTOR LAYER, AND A METHOD FOR MANUFACTURING A SEMICONDUCTOR DEVICE USING THE METHOD OF DETERMINATION

BACKGROUND OF THE INVENTION

1. Field of the Invention

This invention relates to the determination of critical film thickness of compound semiconductor layers and a method for manufacturing semiconductor devices using the method of determination.

2. Description of Related Art

In an incomplete lattice matching system, layers with thickness thinner than critical film thickness and an element which includes strain is formed. To obtain emitting wavelength required for optical elements, the mixed crystal ratio of an active layer and thickness of an active layer are changed. However, to improve the basic performance, carrier or light is confined strongly, or a thin film containing internal strain is used for an active layer or a layer near an active layer to suppress the propagation of defects and dislocations.

However, conventionally dislocation is checked using an electron microscopy to obtain the critical film thickness, the checking work takes much manpower, thus it has been difficult to manufacture optical elements under the optimal condition and semiconductor elements with excellent performance have not been obtained.

SUMMARY OF THE INVENTION

It is an object of the present invention to provide a method of determination of the critical film thickness of a compound semiconductor layer which is excellent in optimization of the critical film thickness, and a method for manufacturing semiconductor devices using the method of determination of the critical film thickness of a compound semiconductor layer which is excellent in optimization of the film thickness of an active layer of optical semiconductor devices.

The present invention provides a method for determination of the critical film thickness of a compound semiconductor layer and a method for manufacturing semiconductor devices using the method of determination to accomplish the above-mentioned objects.

The present invention provides a method for determination of the critical film thickness of a compound semiconductor layer in which the relationship between the film thickness of a compound semiconductor layer and PL intensity obtained by measuring photoluminescence (abbreviated as PL hereinafter) of a compound semiconductor layer corresponding to the film thickness is obtained, and the film thickness at which PL intensity exhibits the peak intensity is designated as the critical film thickness.

The above-mentioned semiconductor layer comprises II–VI group compound semiconductor containing at least cadmium. The maximum peak of emission intensity obtained when PL of a compound semiconductor layer is measured is referred as PL intensity, the relationship between film thickness of a compound semiconductor layer, PL of which layer is measured, and PL intensity corresponding to this film thickness is obtained for each cadmium composition ratio, and from the relationship between film thickness and PL intensity the film thickness where PL intensity exhibits a peak is designated as the critical film thickness for each cadmium composition ratio individually.

For each cadmium composition ratio, the critical film thickness of a compound semiconductor layer is determined, then, an equation which approximates the critical film thickness corresponding to each cadmium composition ratio as calculated, and based on the equation the critical film thickness of a compound semiconductor layer having a desired cadmium composition ratio is determined.

In the case in which the compound semiconductor layer comprises n-type conductive II–VI group compound semiconductor comprising zinc, cadmium and selenium, the relationship is represented by the following equation;

$$y=150-21.6x+1.24x^2-3.18\times10^{-2}x^3+3.03\times10^{-4}x^4 \text{ and } 0<x\leq35,$$

wherein x represents cadmium composition ratio and y represents the critical film thickness.

In the case in which the compound semiconductor layer comprises p-type conductive II–VI group compound semiconductor comprising zinc, cadmium, and selenium, the relationship is represented by the following equation;

$$y=149-21.6x+1.24x^2-3.18\times10^{-2}x^3+3.03\times10^{-4}x^4 \text{ and } 0<x\leq35,$$

wherein x represents cadmium composition ratio and y represents the critical film thickness.

For manufacturing optical semiconductor devices, at first the critical film thickness of an active layer of an optical semiconductor device is prescribed using the method for determination of the critical film thickness of a compound semiconductor layer, then an optical semiconductor device is formed by laminating II–VI group compound semiconductor layer containing an active layer on a semiconductor substrate, when the active layer is formed so as that the thickness is thinner than the prescribed critical film thickness.

In the method for determining the critical film thickness of a compound semiconductor layer, the relationship between the film thickness of an compound semiconductor layer and PL intensity is utilized to determine the critical film thickness, that is, the film thickness where PL intensity exhibits a peak is designated as the critical film thickness. PL intensity increases with increasing of film thickness, correspondingly in the compound semiconductor layer the stable strain condition changes to unstable strain condition in which the misfit dislocation is ready to occur. Then, the strain is relaxed to cause misfit dislocation. The misfit dislocation causes non-radiation transition to reduce rapidly PL intensity. This phenomenon is utilized to determine the critical film thickness, that is, the film thickness of a compound semiconductor layer where the stress-maintained condition changes to the strain-relaxed condition due to misfit dislocation is designated as the critical film thickness.

In the method for determining the critical film thickness in which the relationship between the film thickness of a compound semiconductor layer and PL intensity corresponding to the film thickness is obtained with a parameter of cadmium composition ratio and the film thickness where PL intensity exhibits a peak is designated as the critical film thickness, the critical film thickness of the compound semiconductor layer is determined based on the cadmium content in the compound semiconductor layer.

In the method for determining the critical film thickness in which an approximate equation relating the critical film thickness to each corresponding cadmium composition ratio with a variable of cadmium composition ratio and the critical film thickness of a compound semiconductor layer having a desired cadmium composition ratio is determined using the equation, the equation represents the relationship between cadmium composition ratio in an compound semiconductor layer and experimentally determined critical film thickness obtained by measuring photoluminescence. Therefore, based on a desired cadmium composition ratio in a compound semiconductor layer, the critical film thickness of the compound semiconductor layer having a specified composition ratio is determined accurately.

In the method in which the critical film thickness is determined based on the relationship represented by the following equation;

$$y=150-21.6x+1.24x^2-3.18\times10^{-2}x^3+3.03\times10^{-4}x^4$$

for n-type conduction, and $$y=149-21.6x+1.24x^2-3.18\times10^{-2}x^3+3.03\times10^{-4}x^4$$

for p-type conduction,
wherein x represents cadmium composition ratio and y represents the critical film thickness, the critical film thickness is determined by calculation if the cadmium composition ratio is known. The equation is an equation for a compound semiconductor layer which contains cadmium, consequently cadmium composition ratio x=0 is excepted. In the equation of the critical film thickness y deviates significantly from experimental values in the region x>35. Therefore the range of x is limited as $0<x\leq35$.

In the method for manufacturing semiconductor devices, the critical film thickness of an active layer of optical semiconductor devices are prescribed using the method for determining the critical film thickness of a compound semiconductor layer, then an optical semiconductor device is formed by laminating II–VI group compound semiconductor layers containing the above-mentioned active layer on a semiconductor substrate, when the active layer is formed so as that the thickness is thinner than the prescribed critical film thickness. Therefore, the device transits to the ground state to emit light without non-radiation transition from excited condition, because misfit dislocation does not occur in the active layer.

DETAILED DESCRIPTION OF PREFERRED EMBODIMENTS

At first, photoluminescence (referred to as PL hereinafter) corresponding to each film thickness of a compound semiconductor layer, the critical film thickness of which compound semiconductor layer is to be determined, is measured. PL intensity corresponding to the film thickness of the compound semiconductor layer is measured.

Figure 1:
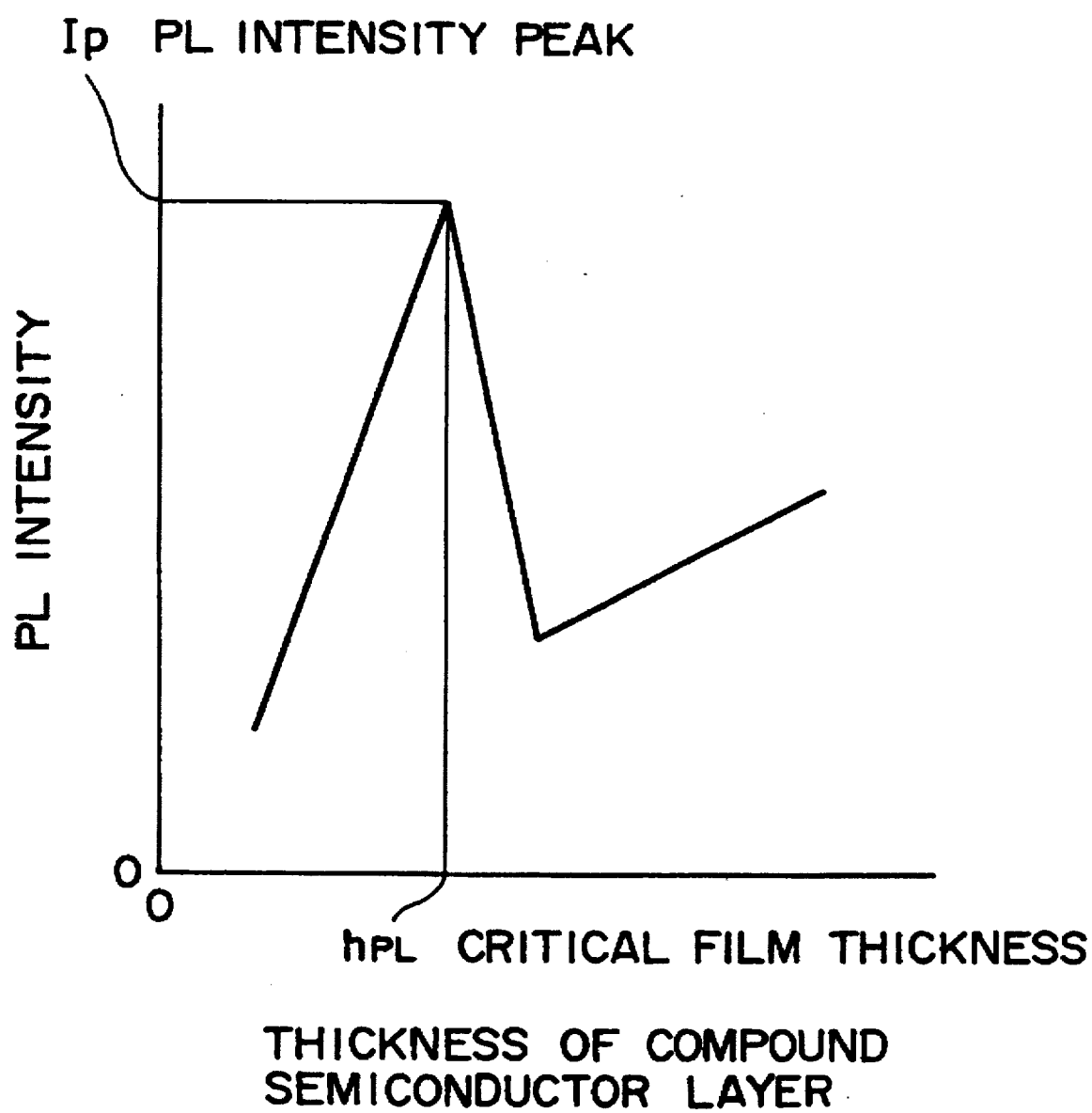
FIG. 1 is a graph for describing the method for determining the critical film thickness in accordance with an embodiment of the present invention.

The result is shown in FIG. 1. FIG. 1 is a graph for describing the method for determining the critical film thickness, the axis of ordinate represents PL intensity of the compound semiconductor layer and the axis of abscissa represents the film thickness of the compound semiconductor layer.

As shown in the figure, the folded line shows the relationship between the film thickness of a compound semiconductor layer and PL intensity obtained by observation of PL of the compound semiconductor layer corresponding to the film thickness. PL intensity decreases with decreasing of the film thickness and PL intensity increases with increasing of the film thickness in some film thickness range. Beyond the PL intensity peak at a certain film thickness, PL intensity decreases rapidly with increasing of the film thickness. Utilizing this phenomenon, the film thickness at which PL intensity exhibits a peak $I_p$ is determined as the critical film thickness $h_{PL}$ of the compound semiconductor layer.

As described herein above, the critical film thickness $h_{PL}$ is determined.

In the method for determining the critical film thickness of a compound semiconductor layer described herein above, the film thickness at which PL intensity exhibits a peak is designated as the critical film thickness $h_{PL}$ utilizing PL intensity change depending on the film thickness of a compound semiconductor layer. PL intensity increase with increasing of the film thickness is attributed to the increase of carrier in a compound semiconductor layer. At a certain film thickness, the strain in the compound semiconductor layer is relaxed to cause misfit dislocation. The misfit dislocation causes non-radiation transition, thus the misfit dislocation results in the decrease of PL intensity. In the present invention, the film thickness at which the strain condition changes from the retained condition to relaxed condition to cause misfit dislocation is determined as the critical film thickness $h_{PL}$ of the compound semiconductor layer.

Figure 2:
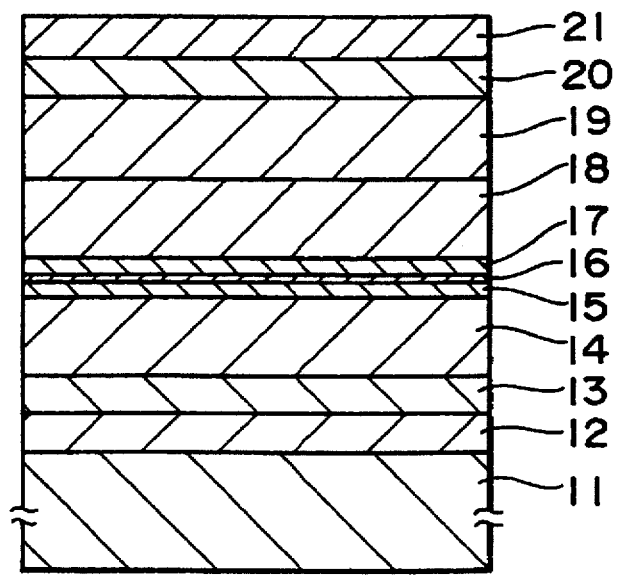
FIG. 2 is a schematic structural diagram of a zinc/selenium semiconductor laser device.

As an example, the determination of the critical film thickness of an active layer of a zinc/selenium semiconductor laser device, which is a bluish green light-emitting device for example as a semiconductor device, especially as an optical semiconductor device, is described herein under. This semiconductor laser device has a structure as shown, for example, in FIG. 2.

That is, the laminated structure comprises, from the bottom to the top, a gallium arsenide (GaAs) substrate 11, a gallium arsenide (GaAs) buffer layer 12 (film thickness of 0.3 μm), a zinc selenium (ZnSe) buffer layer 13 (film thickness of 20 nm), a zinc magnesium sulfur selenium (ZnMgSSe) n-clad layer 14 (film thickness of 0.8 μm), a zinc sulfur selenium (ZnSSe) guide layer 15, a zinc cadmium selenium (ZnCdSe) active layer 16, a zinc sulfur selenium (ZnSSe) guide layer 17, a zinc magnesium sulfur selenium (ZnMgSSe) p-clad layer 18 (film thickness of 0.8 μm), a zinc sulfur selenium (ZnSSe) p-clad layer 19 (film thickness of 0.8 μm), a zinc selenium-zinc tellurium super lattice contact layer 20, and a zinc tellurium (ZnTe) cap layer 21 (film thickness of 80 nm).

Figure 3:
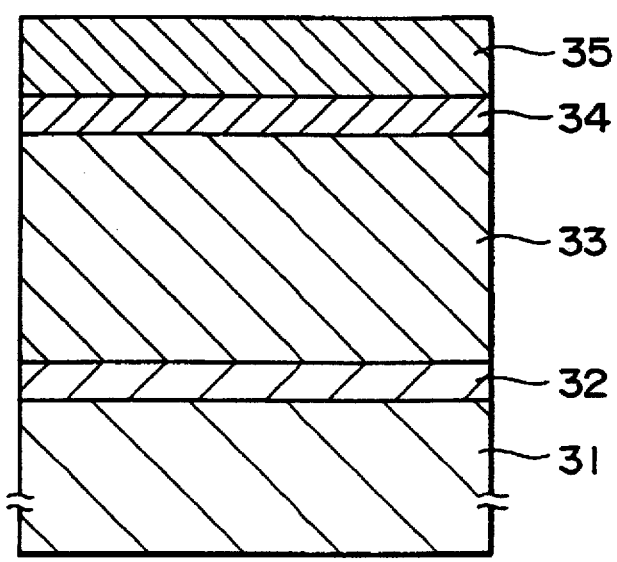
FIG. 3 is a schematic structural diagram of an optical semiconductor device for measurement of PL.

In the present invention, especially the ZnCdSe active layer and epitaxial growth layer near the active layer are addressed. Using an optical semiconductor device 30 having a structure as shown in FIG. 3, which is a simplified structure of the semiconductor device described above in FIG. 2, PL is measured. This optical semiconductor device 30 is structured as described herein under.

The laminated device comprises, from the bottom to the top in FIG. 3, a (100) gallium arsenide (GaAs) substrate 31, a zinc selenium (ZnSe) buffer layer 32 (film thickness of 20 nm), a zinc sulfur selenium ($ZnS_ySe_{1-y}$) guide layer 33 (film thickness of 1 μm), a zinc cadmium selenium ($Zn_{1-x}Cd_xSe$) active layer 34 (a certain film thickness in a range from 2.3 nm to 14.9 nm), and a zinc sulfur selenium ($ZnS_ySe_{1-y}$) guide layer 35 (film thickness of 100 nm), wherein each layer is formed by molecular-beam epitaxy.

Each layer described above is doped to n-type with chlorine (Cl) or each layer described above is doped to p-type with nitrogen (N).

The film thickness of each layer is only for an example and the film thickness is by no means limited to this film thickness.

The critical film thickness of the n-type ZnCdSe layer which is obtained by doping the above-mentioned active $Zn_{1-x}Cd_xSe$ layer 34 with chlorine (Cl) and the p-type Zn CdSe layer which is obtained by doping the above-mentioned active $Zn_{1-x}Cd_xSe$ layer 34 with nitrogen (N) is measured. In this case, cadmium content which is the determinant of strain in $Zn_{1-x}Cd_xSe$ layer is examined in a cadmium content range from 28.5% to 34.3% for n-type and in a cadmium content range from 26.5% to 31.5% for p-type.

Figure 4:
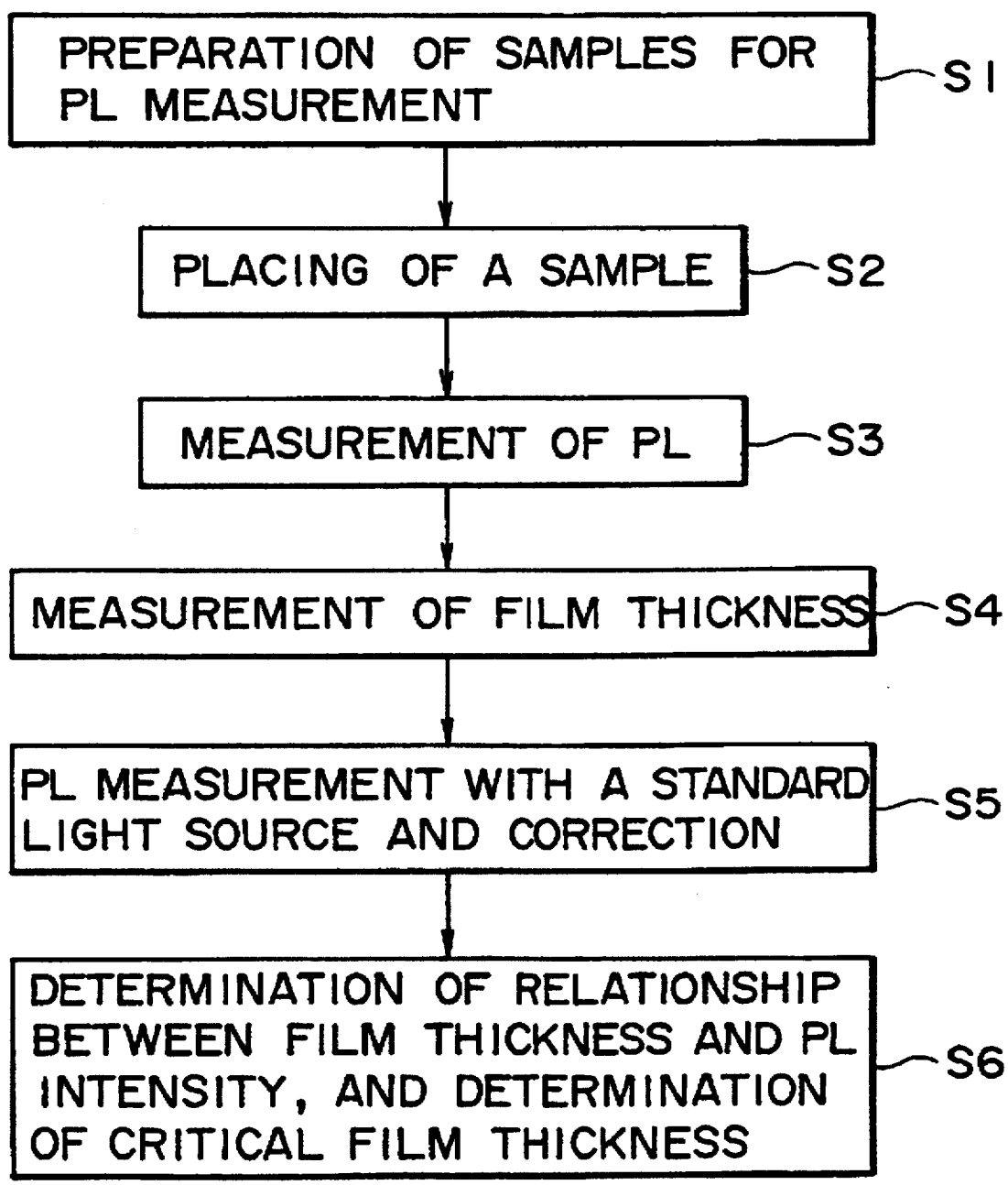
FIG. 4 is a flow sheet for measuring PL.

One example of PL measurement is described briefly referring to FIG. 4.

In the first step, "preparation of samples for PL measurement" S1 is carried out. In this step, the structure Shown in FIG. 3 is cleaved to make a suitable piece (for example 5 mm*5 mm) to prepare a sample. The sample is stored in a inert atmosphere to keep it clean.

The measurement of PL of the sample is carried out in a room temperature or low temperature atmosphere so as that spectrum peaks are finely resolved and identified accurately. For measurement in a low temperature atmosphere, a cryostat for liquid nitrogen or liquid helium is employed.

In the second step, "placing of a sample" S2 is carried out. In this step, a sample is placed on the cryostat.

In the third step, "measurement of PL" S3 is carried out. In this step, for example, a helium-cadmium (He-Cd) laser is irradiated on the sample to measure PL. That is, spectrum of light emitted from the active layer and clad layer, which light is emitted when carrier excited by irradiation of the laser transits to ground state, is measured. For the PL measurement, argon (Ar) laser, helium (He)-Neon (Ne) laser, and dye laser are also used.

In the fourth step, "measurement of film thickness" S4 is carried out. In this step, the film thickness of the clad layer is measured to obtain the film thickness of the active layer.

In the fifth step, "PL measurement with a standard light source and correction" S5 is carried out. In this step, PL is measured using a standard light source such as argon (Ar) laser. Based on spectrum of emission wavelength of PL when a standard light source is used, previously determined emission wavelength of the spectrum is corrected considering such factors as lattice deviation due to the difference in lattice constant of the gallium arsenide (GaAs) substrate and clad layer, the difference in carrier concentration, and effect of a spectrometer, and thus the true PL intensity is determined.

In sixth step, "determination of relationship between film thickness and PL intensity, and determination of critical film thickness" S6 is carried out. In this step, the relationship between the film thickness of active layer and true PL intensity is obtained with a parameter of cadmium composition ratio of the active layer. The film thickness where PL intensity exhibits a peak is determined as the critical film thickness.

Figure 5:
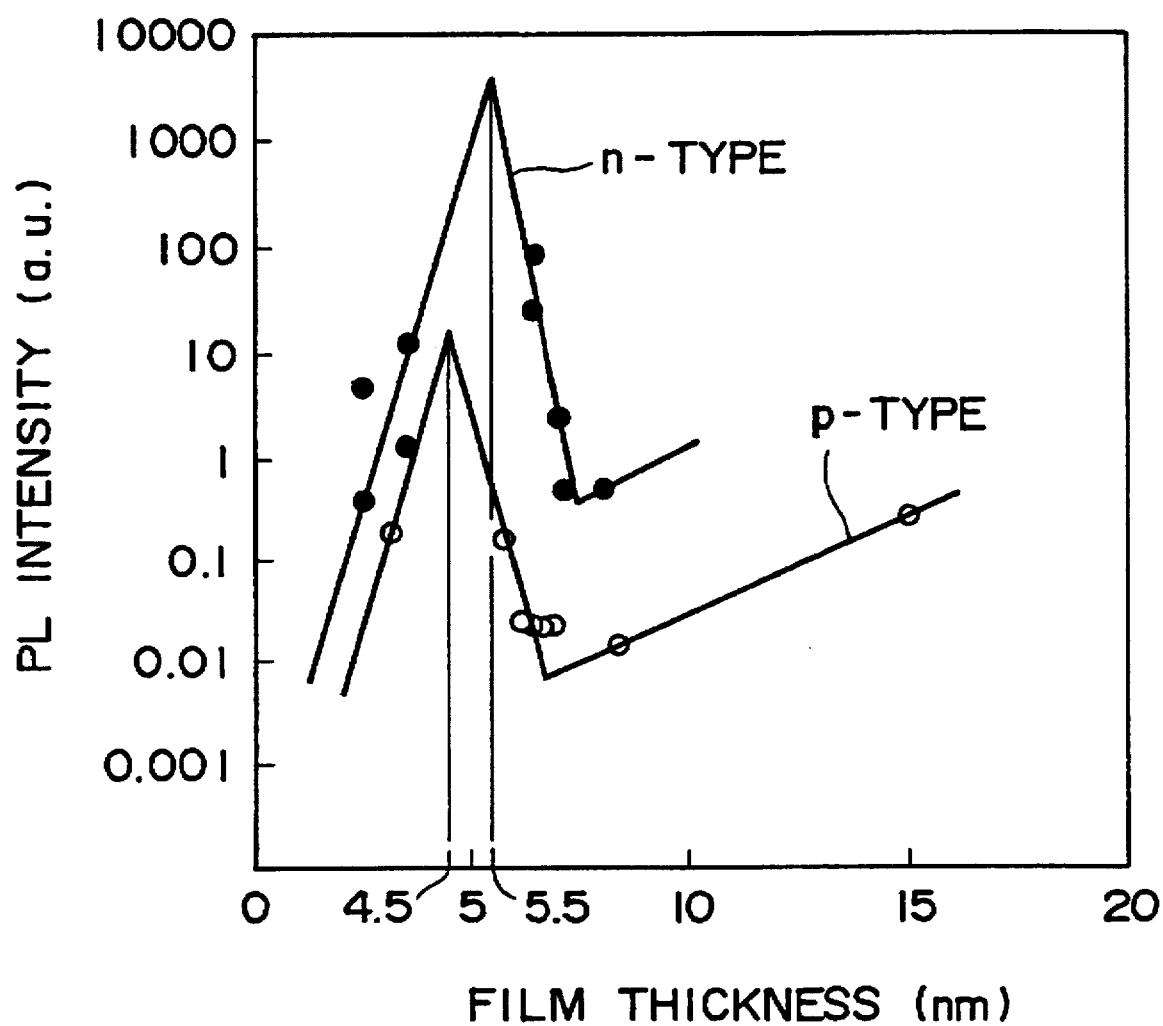
FIG. 5 is a graph for describing the relationship between the film thickness and PL intensity.

The result is described referring to FIG. 5 of the relationship between the film thickness and PL intensity.

As shown in FIG. 5, it is found that the critical film thickness of n-type ZnCdSe layer is thicker than that of p-type ZnCdSe layer.

The thinner critical film thickness of p-type layer is presumably attributed to the fact that, for example, p-type dopant nitrogen (N) is trapped in the lattice of II–VI group compound semiconductor layer, and the activation of p-type compound semiconductor layer is low, and thus the compound semiconductor layer is easily strained.

The critical film thickness of ZnCdSe layer is 4.5 nm for p-type ZnCdSe layer and 5.5 nm for n-type ZnCdSe layer as shown in the figure.

In the case of the above-mentioned $Zn_{1-x}Cd_xSe$ mixed crystal system, the strain changes depending on cadmium composition ratio.

For example, the critical film thickness decreases with increasing of cadmium composition ratio and the critical film thickness increases with decreasing of cadmium composition ratio.

Therefore, the critical film thickness corresponding to the cadmium composition ratio in compound semiconductor layers is required to be determined.

At first, PL is measured with parameter of cadmium content in compound semiconductor layers. PL of a compound semiconductor layer corresponding to the film thickness of the compound semiconductor layer is measured, and obtained maximum peak emission intensity, namely PL intensity, corresponding to this film thickness is plotted against the film thickness of compound semiconductor layers. Then, in the relationship between the film thickness and PL intensity, the film thickness where PL intensity exhibits a peak is obtained, and that film thickness is designated as critical film thickness. Then, the relationship between cadmium composition ratio and the critical film thickness determined as described herein above is obtained. The result is described referring to FIG. 6.

In the figure, the axis of ordinate represents the critical film thickness and the axis of abscissa represents cadmium composition ratio.

Figure 6:
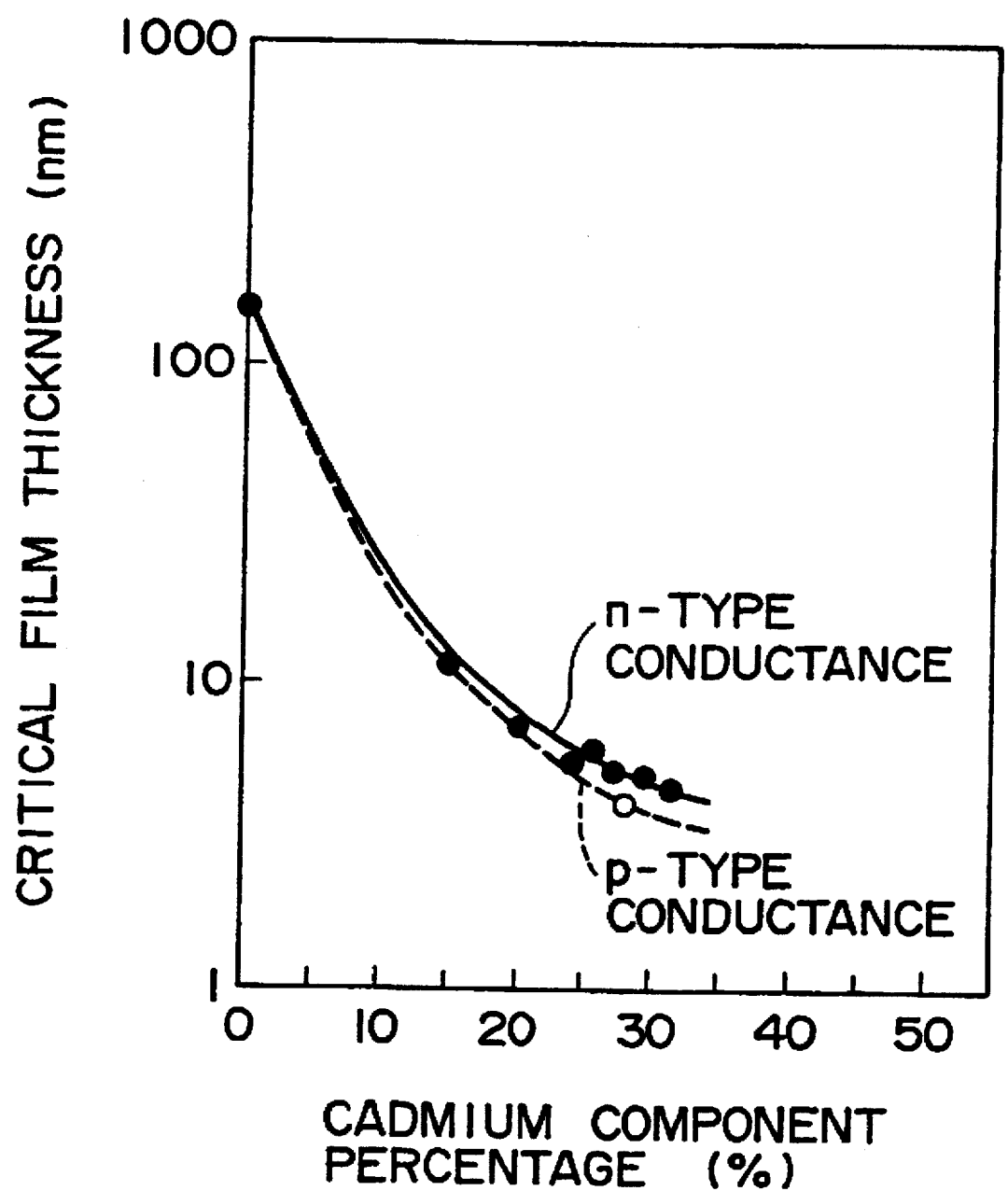
FIG. 6 is a graph for describing the relationship between the cadmium composition ratio and the critical film thickness.

As shown in FIG. 6, from the relationship between the critical film thickness of the compound semiconductor layer and cadmium content, it is found that the critical film thickness decreases with increasing of cadmium content. The decreasing of critical film thickness is attributed to the increasing of strain in the compound semiconductor layer with increasing of cadmium content. The critical film thickness changes depending on cadmium content as described herein above, therefore, cadmium content of the semiconductor layer must be taken into consideration when the critical film thickness of an active layer is prescribed. The film thickness of an active layer should be thinner than critical film thickness. If the film thickness of an active layer is thicker than the critical film thickness, the thicker thickness will result in degraded basic performances of the device such as shorter life and reduced reliability due to relaxation of strain in the active layer and misfit dislocation.

It is found that the critical film thickness of n-type conduction is different from that of p-type conduction at the same cadmium composition ratio.

Referring to the relationship between the critical film thickness of a compound semiconductor (ZnCdSe) layer and cadmium content contained in this ZnCdSe layer obtained as described herein above, the critical film thickness corresponding to a certain cadmium content in ZnCdSe layer is obtained. The cadmium content is proportional to the strain in ZnCdSe layer. Therefore, the film thickness of ZnCdSe layer is determined with regard to cadmium content.

The relationship between cadmium content in ZnCdSe layer and critical film thickness shown in FIG. 6 is approximated by an equation.

Cadmium composition ratio is represented by x (%) (herein represented by (%)) and critical film thickness of ZnCdSe layer is represented by y (nm). For n-type conductive ZnCdSe layer (solid line in FIG. 6) the relationship is represented by (1) equation. In this case, n-type conduction is obtained by doping with chlorine (Cl).

$$y=150-21.6x+1.24x^2-3.18\times10^{-2}x^3+3.03\times10^{-4}x^4 \quad (1)$$

For p-type conductive ZnCdSe layer (rough dotted line in FIG. 6) the relationship is represented by (2) equation. In this case, p-type conduction is obtained by doping with nitrogen (N).

$$y=149-21.6x+1.24x^2-3.18\times10^{-2}x^3+3.03\times10^{-4}x^4 \quad (2)$$

According to the method in which equations (1) and (2) for approximating the critical film thickness corresponding to each cadmium composition ratio is obtained with a variable of cadmium composition ratio as describe herein above and based on the equations the critical film thickness of a compound semiconductor layer having desired cadmium composition ratio is obtained, the equations approximates the real relationship between cadmium composition ratio in a compound semiconductor layer and the critical film thickness experimentally determined by measuring photoluminescence. Therefore, depending on desired cadmium composition ratio in the compound semiconductor layer, the critical film thickness of a compound semiconductor layer of the composition ratio is determined accurately.

As described above, using the equation (1) for n-type conduction and the equation (2) for p-type conduction in which cadmium composition ratio is represented by x (%) (herein represented by (%) and the critical film thickness is represented by y (nm), the critical film thickness is easily calculated by giving a certain cadmium composition ratio. The above-mentioned equations (1) and (2) are addressed on cadmium-containing compound semiconductor layer, therefore, cadmium composition ratio x=0 is an exception. In the range x>35, the critical film thickness y increases excessively and the deviation from the experimental value increases. Due to the deviation, the range of x to be applied is $0<x\leq35$.

In the next, the manufacturing method of an optical semiconductor device described in FIG. 3 is described referring to above-mentioned FIG. 3 in which a laminated II–VI group compound semiconductor layer containing an active layer comprising II–VI group compound semiconductor layer is used.

The critical film thickness of II–VI group compound semiconductor layer which is an active layer of the optical semiconductor device is prescribed using the method for determination of the critical film thickness of a compound semiconductor layer described hereinbefore.

Afterward, II–VI group compound semiconductor layers are deposited on a gallium arsenide (GaAs) substrate by molecular-beam epitaxy to form a laminate. When, the ZnCdSe layer 16 is formed so as that the film thickness of an active ZnCdSe layer 16 does not exceed the critical film thickness.

As described herein above, an optical semiconductor device 10 is formed.

In the above-mentioned manufacturing method of an optical semiconductor device 10, the critical film thickness of the active ZnCdSe layer 16 of an optical semiconductor device is prescribed using the method for determination of critical film thickness of a compound semiconductor layer, then, II–VI group compound semiconductor layers are laminated on a gallium arsenide (GaAs) substrate 11 to form an optical semiconductor device. When, the above-mentioned ZnCdSe layer 16 is formed with a film thickness thinner than the prescribed critical film thickness.

Therefore, the strain in ZnCdSe layer (active layer) 16 of the optical semiconductor device is not relaxed and consequently misfit dislocation does not occur. In such an optical semiconductor device 10, excited condition transits to ground state without non-radiation transition and the device emits light.

As described hereinbefore, by using the method for determining critical film thickness of a compound semiconductor layer in accordance with the present invention, the change of PL intensity depending on the film thickness of a compound semiconductor layer is utilized to determine the critical film thickness, namely a film thickness value where PL intensity exhibits a peak, thus the critical film thickness of a II–VI group compound semiconductor layer is obtained by a simple method which only involves the measurement of PL, before, such critical film thickness can not be determined conventionally. This method results in easy designing of a semiconductor device, especially optical semiconductor device, and also a device excellent in emission performance can be designed.

According to the method in which the relationship between the film thickness of a compound semiconductor layer and PL intensity corresponding to this film thickness is obtained with a parameter of cadmium composition ratio and the film thickness where PL intensity exhibits a peak in this relationship is obtained as a critical film thickness, thus a critical film thickness which corresponds to a cadmium content is obtained.

According to the method in which an equation with a variable of cadmium composition ratio is obtained to approximate the critical film thickness which corresponds to each cadmium composition ratio and the critical film thickness of a compound semiconductor layer which corresponds to a desired cadmium composition ratio is obtained using the equation, the equation approximates the experimentally obtained critical film thickness, therefore, corresponding to a desired cadmium composition ratio in a compound semiconductor layer, the critical film thickness of the compound semiconductor layer having the composition ratio is obtained accurately.

According the method in which the critical film thickness is obtained using the equations;

$$y=150-21.6x+1.24x^2-3.18\times10^{-2}x^3+3.03\times10^{-4}x^4$$

for n-type conduction, and $$y=149-21.6x+1.24x^2-3.18\times10^{-2}x^3+3.03\times10^{-4}x^4$$

for p-type conduction,
wherein x represents cadmium composition ratio and y represents critical film thickness, the critical film thickness can be calculated easily only by giving a cadmium composition ratio.

According to the manufacturing method of a semiconductor layer of the present invention, the critical film thickness of an active layer of an optical semiconductor device is obtained using the method for determination of the critical film thickness of an compound semiconductor layer, and the actual thickness of the active layer is designed so as to be thinner than the obtained critical film thickness, and the active layer of the optical semiconductor device is formed as designed, thus the optical semiconductor device transits from excited condition to ground state without non-radiation transition to emit light. This mechanism of emission result in the improved emission performance of the device.

What is claimed is:

1. A method for obtaining critical film thickness of a compound semiconductor layer, comprising the steps of:

obtaining relationship between said film thickness of a compound semiconductor layer and photoluminescence intensity obtained by measuring photoluminescence of said compound semiconductor layer corresponding to said film thickness; and designating as said critical film thickness in which said photoluminescence exhibits a peak in said relationship.

2. The method for obtaining critical film thickness of a compound semiconductor layer according to claim 1, wherein said compound semiconductor layer comprises II-VI group compound semiconductor containing at least cadmium.

3. The method for obtaining critical film thickness of a compound semiconductor layer according to claim 2, wherein said method comprises the steps of:

obtaining the relationship between film thickness of said compound semiconductor layer and said photoluminescence intensity corresponding to said film thickness for said cadmium composition ratio respectively, and designating film thickness where photoluminescence intensity exhibits a peak in said relationship as critical film thickness for each cadmium composition ratio.

4. The method for obtaining critical film thickness of a compound semiconductor layer according to claim 3, wherein said method comprises the steps of:

obtaining the critical film thickness of a compound semiconductor layer by measuring photoluminescence for each different cadmium composition ratio, and obtaining an equation which approximates each critical film thickness corresponding to each cadmium composition ratio having a variable of cadmium composition ratio.

5. A method for manufacturing a semiconductor device having a laminated layer of II-VI group compound semiconductor layers comprising at least cadmium on a semiconductor substrate, comprising the steps of:

obtaining relationship between film thickness and photoluminescence of said compound semiconductor layer corresponding to said film thickness; and designating as the critical film thickness in which said photoluminescence exhibits a peak in said relationship, when a semiconductor device is manufactured by laminating II-VI group compound semiconductor layers on said semiconductor substrate, the thickness of said compound semiconductor layer is formed so as to be equal to or less than said critical film thickness.

6. The method for manufacturing a semiconductor device according to claim 5, wherein said semiconductor device comprises an optical semiconductor device.

7. The method for manufacturing a semiconductor device according to claim 6, wherein said II-VI group compound semiconductor layer is active layer of a semiconductor laser device.

* * * * *